United States Patent

Frederiksen

[15] 3,648,069

[45] Mar. 7, 1972

[54] DIFFERENTIAL TRIGGER CIRCUIT

[72] Inventor: Thomas M. Frederiksen, Scottsdale, Ariz.

[73] Assignee: Motorola, Inc., Franklin Park, Ill.

[22] Filed: Oct. 13, 1970

[21] Appl. No.: 80,272

[52] U.S. Cl. ............................307/235, 307/288, 330/30 D

[51] Int. Cl. ..........................................................H03k 5/20

[58] Field of Search.................307/235, 264, 290, 291, 288; 330/30 D

[56] References Cited

UNITED STATES PATENTS

| | | | |
|---|---|---|---|
| 3,328,599 | 6/1967 | Stupar | 307/235 |
| 3,401,350 | 9/1968 | Barton et al. | 330/30 |
| 3,432,688 | 3/1969 | Zola | 330/30 X |
| 3,519,850 | 7/1970 | Smith | 307/235 |

*Primary Examiner*—Donald D. Forrer
*Assistant Examiner*—John Zazworsky
*Attorney*—Mueller & Aichele

[57] ABSTRACT

An integrated, differential, symmetrical-hysteresis trigger circuit includes an input differential amplifier using lateral PNP-transistors, driving an output differential switch using cascaded NPN-transistors. A first current source supplies operating current to the input differential amplifier and a second current source provides operating current for the emitters of the transistors in the output differential amplifier. The collector of one of the output differential amplifier transistors is connected to a third current source, providing current which is less than that provided by the first and second current sources; and a feedback circuit provides snap-action switching of the output differential amplifier. The hysteresis of operation of the circuit is controlled by the magnitude of the emitter resistors in the input differential stage.

13 Claims, 3 Drawing Figures

Inventor
THOMAS M. FREDERIKSEN
BY
Mueller & Aichele
ATTYS.

DIFFERENTIAL TRIGGER CIRCUIT

BACKGROUND OF THE INVENTION

Many applications exist for a threshold trigger circuit which has an operation which is independent of variations in supply voltage and which has a controlled or symmetrical hysteresis of operation for input signals of varying threshold levels. Schmitt trigger circuits and other threshold trigger circuits are known for providing output signals indicative of the level of an input signal above or below a particular reference value. Such circuits also have been provided with hysteresis of operation, that is switching from the first state to the second state occurs at one level of an input signal whereas the switching from the second state to the first state then occurs at a different level depending upon the particular parameters which are utilized for establishing the hysteresis. It is desirable to have a symmetrical hysteresis, changing states at equal amounts above and below the nominal switching level, for many applications.

Many threshold switching circuits require feedback capacitors so that they are unsuitable for integrated circuit applications. In addition many such switching circuits are single-ended. For the most ideal utilization of integrated circuit techniques, however, it is desirable to employ a differential switch or differential amplifier type of configuration. It also is desirable to provide symmetry of operation in the hysteresis of the circuit in order to control the immunity of the circuit to false triggering due to noise.

SUMMARY OF THE INVENTION

Accordingly it is an object of this invention to provide an improved trigger circuit.

It is an additional object of this invention to provide an improved trigger circuit having symmetrical hysteresis of operation.

It is a further object of this invention to produce a differential trigger circuit capable of fabrication in integrated circuit form.

It is still another object of this invention to use multiple current sources in a symmetrical differential trigger circuit to cause the operation of the trigger circuit to be independent of variations in the supply voltage.

In accordance with the preferred embodiment of this invention, an input switch means is coupled between a source of operating current and first and second outputs to provide current to one or the other of the outputs in accordance with the condition of operation of the switch means.

These outputs control the operation of a differential switching circuit including at least two transistors, the bases of which are coupled, respectively, to the first and second outputs. A second current source connected to the common junction of the emitters of the two transistors determines the total current flowing through the differential switching circuit. The collector of one of the transistors is connected to a third current source at a junction which also is connected to the output coupled to the base of the other transistor. A feedback circuit is provided between the two outputs and operates in conjunction with the third current source to cause rapid switching of the differential switching circuit from one state to another.

DETAILED DESCRIPTION

Figures 1, 2, 3:
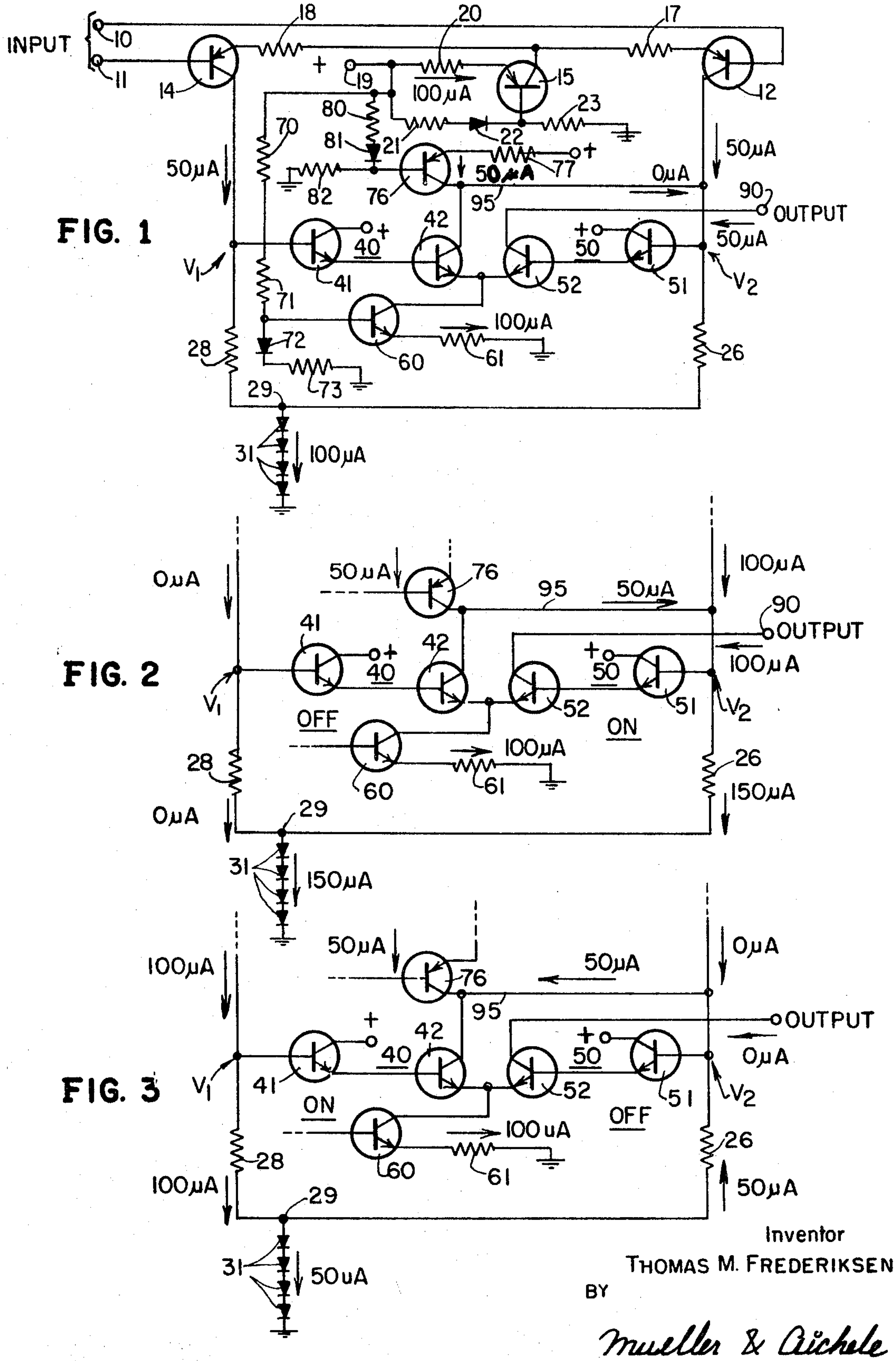
FIG. 1 is a circuit diagram of a preferred embodiment of the invention illustrating the operation of the circuit in an unstable or transient switching condition.
FIG. 2 shows a portion of the circuit of FIG. 1, illustrating operation of the circuit in one of its two stable states.
FIG. 3 shows a portion of the circuit of FIG. 1, illustrating operation of the circuit in the other of its two stable states.

Referring now to the drawing, wherein the same reference numbers are used throughout the several views to designate the same elements, there is shown in FIG. 1 a fully differential, symmetrical-hysteresis trigger circuit in accordance with a preferred embodiment of the invention. The circuit shown in FIG. 1 preferably is fabricated as a monolithic integrated circuit, either as an independent trigger or switching circuit or as part of a larger array involving circuits performing other operations.

Differential input signals for operating the trigger circuit shown in FIGS. 1, 2 and 3 are applied to a pair of input terminals 10 and 11, with the signals applied to the terminals 10 and 11 being 180° out of phase. The input terminal 10 is connected to the base of a lateral PNP-transistor 12, with the input terminal 11 being connected to the base of a corresponding lateral PNP-transistor 14. The input transistors 12 and 14 constitute an input differential amplifier, which is supplied with operating current from a lateral PNP-current-source transistor 15, the collector of which is connected to a junction between a pair of emitter resistors 17 and 18, which in turn are connected to the emitters of the transistors 12 and 14, respectively.

The current supplied by the current source transistor 15 is obtained from a source of positive potential coupled to a supply terminal 19, through an emitter resistor 20; and the conductivity of the transistor 15 is controlled by a bias voltage established by a voltage divider consisting of a resistor 21, a diode 22, and a resistor 23, connected between the positive supply terminal with the junction of the diode 22 and the resistor 23 being connected to the base of the transistor 15.

For purposes of illustration, assume that the parameters of the current supply circuit are such that the current source transistor 15 supplies 100 microamps of current to the junction of the resistors 17 and 18. The diode 22 provides temperature compensation for the base-emitter junction of the transistor 15 so that the transistor 15 supplies this 100 microamps of current over relatively wide ranges of variations of the voltage supply and temperature.

The emitter resistors 17 and 18 control the gain of the input differential amplifier, including the transistors 12 and 14, which in turn establishes the threshold window or the hysteresis of operation of the trigger circuit. By adjusting the values of the resistors 17 and 18, the point is established at which the switching action of the circuit occurs following a zero crossing in the input signal applied to the terminals 10 and 11. Thus the delay in switching operation following such a zero crossing may be adjusted by varying the gain in accordance with different values of the resistors 17 and 18. For any specific application of the circuit, the resistors 17 and 18 may be fabricated directly as part of the integrated circuit and are of fixed value once the circuit parameters have been determined. If adjustability in the hysteresis of operation is desirable, the resistors 17 and 18 may be in the form of discrete variable potentiometers located off the integrated circuit chip on which the remainder of the circuit is formed. The operation of the circuit, however, is the same in either case. In conjunction with the circuit shown in FIG. 1, assume that the input signals applied to the terminals 10 and 11 are of equal magnitude, so that both of the transistors 12 and 14 are equally conductive. This is an unstable or transient switching state of the circuit and occurs during a switching operation of the circuit from one of its two stable states to the other. In this unstable state with the transistors 12 and 14 equally conductive, each of the transistors 12 and 14 supplies 50 microamps of current at its collector. These currents are supplied through resistors 26 and 28, respectively, to a common junction 29 which interconnects the resistors 26 and 28. At the junction 29, the currents are combined, with 100 microamps of current flowing through a diode string 31 to ground. This current flowing through the diode string 31 is equal to the current supplied by the current source transistor 15 to the junction of the resistors 17 and 18.

The output stage of the differential switching circuit includes a Darlington NPN-differential amplifier having a pair of Darlington-cascaded stages 40 and 50, each including a pair of NPN-transistors 41, 42 and 51, 52, respectively.

Input signals for the Darlington stage 40 are applied to the base of the transistor 41 from the junction of the collector of the transistor 14 with the resistor 28. Similarly, input signals for the Darlington stage 50 are applied to the base of the transistor 51 which is connected to the junction of the collector of the transistor 12 with the resistor 26. The collectors of the transistors 41 and 51 are connected to a source of positive operating potential, with the emitters of the transistors 41 and 51 being connected, respectively, to the bases of the transistors 42 and 52. These latter transistors are connected in a differential circuit configuration, with the emitters coupled together at a common junction connected to a constant current source in the form of an NPN-current-source transistor 60, the emitter of which is connected through an emitter resistor 61 to ground. The base of the transistor 60 is provided with a stable-operating bias potential from a voltage divider, comprising resistors 70, 71, a diode 72 and a further resistor 73, connected in series between the positive supply terminal 19 and ground.

The parameters of the circuit for controlling the operation of the current source transistor 60 are such that the transistor 60 draws 100 microamps of current. Thus, the total combined current flowing through the differential amplifier transistors 42 or 52 is limited to 100 microamps.

In the example being considered in conjunction with FIG. 1, the potential on the bases of the transistors 41 and 51 is equal since the current flowing through the resistors 26 and 28 is equal for this unstable transient state of operation of the circuit. As a consequence, the transistors 42 and 52 both are rendered equally conductive; so that the 100 microamps of current flowing through the current source transistor 60 is equally divided between the transistors 42 and 52.

The current flowing through the transistor 42 is obtained from a lateral PNP-current-source transistor 76, the collector of which is connected directly to the collector of the transistor 42, and the emitter of which is connected through an emitter resistor 77 to a source of positive operating potential. The conductivity of the transistor 76 is controlled by a voltage divider consisting of a resistor 80, a diode 81, and a resistor 82 connected between the supply terminal 19 and ground, with the base of the transistor 76 being connected to the junction of the cathode of the diode 81 and the resistor 82. The diode 81 provides temperature compensation for the current source transistor 76 in a manner similar to the temperature compensation provided by the diodes 22 and 72 for the other two current source transistors, previously described. The parameters of the circuit including the current source transistor 76 are such that the transistor 76 draws 50 microamps of current from the supply and supplies this current to the collector of the transistor 42. Since for the set of conditions illustrated in FIG. 1, the transistor 42 also draws 50 microamps of current, all of the current supplied by the transistor 76 flows through the transistor 42.

As stated previously, the transistor 52 also draws 50 microamps of current during the transient, unstable state of operation illustrated in FIG. 1. The collector of the transistor 52 constitutes the output terminal of the switching circuit; so that this 50 microamps must be supplied from the output of the circuit. The amount of current drawn by the transistor 52 is determined by the current source transistor 60 and is limited to 50 microamps since the current source transistor 60 only draws 100 microamps of current and the transistor 42 is supplying 50 microamps of current at this time. The load connected to the output terminal 90 may be of any suitable type capable of supplying current to the transistor 52, and the load has not been shown since the configuration of the load does not form part of the switching circuit.

The diodes 31 establish a bias voltage at the terminal 29, and therefore at the bases of the transistors 41 and 51, to properly bias the Darlington differential amplifier 40, 50 for operation. The particular number of diodes used in the diode string 31 may be varied in accordance with the biasing requirements of the circuit, and these diodes preferably are formed as the base-emitter junctions of shorted base-collector transistors in a known manner.

An additional feedback connection is provided by a lead 95 connected between the collector of the current source transistor 76 and the junction of the base of the transistor 51 with the collector of the transistor 12. With the circuit operating conditions being as described above in conjunction with FIG. 1 no current flows through the lead 95.

Now referring to FIG. 2, the differential amplifier output portion of the circuit is shown with a different set of operating conditions corresponding to the binary "1" stable state of operation of the switching circuit. The portions of the circuit which are not shown in FIG. 2 are the same as in FIG. 1 and have been eliminated for the purpose of clarity. In the binary "1" state of operation shown in FIG. 2, the input transistors 12 and 14 shown in FIG. 1 are respectively fully conductive and nonconductive. As stated previously the time required to effect this switching or state of conduction of the input transistors 12 and 14 is determined by the emitter resistors 17 and 18; but once this switching has taken place, the full 100 microamps of current flows through the transistor 12 and no current flows through the transistor 14, since it is nonconductive. This has been indicated in FIG. 2 which illustrates that 0 microamps of current are flowing through the resistor 28. In this condition of operation, the Darlington transistors 41 and 42 also are biased to nonconduction; so that no current flows through the transistor 42. The current source transistor 60, however, continues to draw 100 microamps of current.

The Darlington transistors 51 and 52 are biased into a full state of conduction by the potential appearing across the resistor 26, so that this full 100 microamps of current is drawn by the transistor 52. Thus, the load connected to the output terminal 90 supplies 100 microamps of current to the transistor 52.

The current source transistor 76 also continues to draw 50 microamps of current with this current now being supplied over the lead 95 to be added to the 100 microamps of current supplied from the transistor 12. Thus, a total of 150 microamps of current flows through the resistor 26 and the string of diodes 31 to ground. The additional current supplied over the lead 95 to the resistor 26 increases from the 0 microamps of current, for the condition of operation previously described in conjunction with FIG. 1, to the full 50 microamps when the state of switching is completed. This additional current operates as a positive feedback to speed up the switching operation of the Darlington differential switching stage 40, 50 to provide a snap-action switching operation, once the switching of the conductive states of the transistors 42 and 52 commences. The stable state of operation for the binary "1" condition is indicated in FIG. 2 with the currents shown in FIG. 2 flowing through the various portions of the circuit.

If the input signal applied to the terminals 10 and 11 of FIG. 1 then crosses through zero to a point where the potential on the terminal 11 is more negative than the potential on the terminal 12, the transistor 14 is rendered conductive and the transistor 12 is rendered nonconductive in accordance with the hysteresis established by the resistors 17 and 18. As the conductivity of the transistors 12 and 14 shown in FIG. 1 changes, the transistor 14 commences drawing current and the current supplied through the transistor 12 is reduced. This, in turn, causes the conductivities of the transistors 41, 42 and 51, 52, to be changed, with the transistors 41 and 42 being rendered increasingly conductive and the transistors 51 and 52 being rendered increasingly nonconductive until the second stable state of the switching circuit corresponding to a binary "0" is reached. This stable state is illustrated in FIG. 3.

Once the equilibrium condition of operation of the circuit shown and described previously in conjunction with FIG. 1 is reached, the transistor 52 draws less than 50 microamps of current from the load while the transistor 42 then must draw more than 50 microamps of current in order to cause the full 100 microamps of current to flow through the current source transistor 60 and the resistor 61 to ground. Since the current source transistor 76 only supplies 50 microamps of current to the collector of the transistor 42, the additional current in excess of this 50 microamps must be drawn from the lead 95 connected to the collector of the transistor 42. This additional current is supplied from the collector of the transistor 14 around the loop through the resistors 28 and 26. This increases the rate of drip of the potential on the base of the transistor 51, thereby speeding up the switching off of the Darlington stage 50. When the Darlington stage 50 is rendered fully nonconductive, the Darlington stage 40 is rendered fully conductive, with the transistor 42 drawing 100 microamps of current. The current source transistor 76 supplies 50 microamps of this current and 50 microamps are supplied from the collector of the transistor 14 around the loop including the resistors 28 and 26 and the lead 95. In this state of operation, 50 microamps of current flows through the diode string 31 to ground.

It should be noted that symmetrical operation of the circuit takes place and that in either stable state of operation, a full 100 microamps of current are drawn by the transistor 42 or 52 in accordance with which of the two states of operation the circuit is placed. The feedback circuits, which include the lead 95 and the resistors 26 and 28, operate to provide a positive or regenerative feedback to the Darlington output stage 40, 50 and increase the switching speed of the circuit. Thus, a snap-action type of switching is attained once the conductivity balance of the input stage 12, 14 changes from one state to the other.

The hysteresis delay or hysteresis "window" which determines the switching point after the input signal applied to the terminals 10 and 11 passes through a zero point, or a point at which both the transistors 12 and 14 are equally conductive, is determined by the gain of the transistors 12 and 14. This in turn is established by the magnitudes of the resistors 17 and 18. With the resistors 17 and 18 being equal and the resistors 26 and 28 being equal, the hysteresis window is equal on both sides of this zero crossing; so that a fully symmetrical operation of the circuit takes place. The circuit is balanced and the differential amplifier configuration readily lends itself to an integrated circuit fabrication of the circuit. No capacitors are required which further causes the circuit to be readily adaptable for integrated circuit technologies.

What is claimed is:

1. A differential trigger circuit including in combination:
a first source of operating current;
input switch means coupled to the first source of operating current and having first and second outputs for switching operating current from said source to said outputs;
differential switch means including at least first and second transistors, each having collector, base, and emitter electrodes, with the emitter electrodes thereof being connected together at a first common junction;
first and second voltage supply terminals adapted for connection across a supply potential;
a second current source connected between the first common junction and the first supply terminal;
a third current source connected between the second supply terminal and the collector of the first transistor;
means connecting the first output of the input switch means with the base of the first transistor;
means connecting the second output of the input switch means with the base of the second transistor; and
means connecting the collector of the first transistor with the second output of the input switch means, the collector of the second transistor providing an output from the trigger circuit; and
feedback circuit means interconnecting the first and second outputs of the input switch means.

2. The combination according to claim 1 wherein the feedback circuit means includes first and second resistors connected together in series at a second junction between the first and second outputs of the input switch means and further includes means connected with the second junction for establishing a predetermined potential at said second junction.

3. The combination according to claim 1 wherein the first and second transistors are first and second switching transistors and further including first and second input transistors, each including collector, base, and emitter electrodes, with the collector electrodes of the first and second input transistors being coupled with the second voltage supply terminal, the base electrode of the first input transistor being coupled with the first output of the input switch means, the emitter electrode of the first input transistor being connected to the base electrode of the first switching transistor, the emitter electrode of the second input transistor being connected to the base electrode of the second switching transistor, and the base electrode of the second input transistor being coupled with the second output of the input switch means.

4. The combination according to claim 1 wherein the input switch means comprises a second differential switch means including third and fourth transistors, each having collector, base, and emitter electrodes, with the base electrodes of the third and fourth transistors adapted to receive an input signal, the emitter electrodes being connected with the source of operating current, and the collector electrodes of the third and fourth transistors comprising the first and second outputs.

5. The combination according to claim 4 further including first and second emitter resistors with the first emitter resistor connected between the source of operating current and the emitter electrode of the third transistor and the second emitter resistor connected between the source of operating current and the emitter electrode of the fourth transistor.

6. The combination according to claim 5 wherein the source of operating current is a constant current source connected between the second voltage supply terminal and the junction of the first and second emitter resistors, and the current supplied by the second current source is less than the current supplied by the first or third current sources.

7. A differential trigger circuit including in combination:
a first differential switch means including first and second transistors, each having a collector, base, and emitter;
means for supplying input signals to the bases of the first and second transistors;
a first current source coupled with the emitters of the first and second transistors;
a second differential switch means including at least third and fourth transistors, each having a collector, base, and emitter, with the emitters thereof being connected together at a first junction;
means for connecting the base of the third transistor with the collector of the first transistor;
means for connecting the base of the fourth transistor with the collector of the second transistor;
first and second voltage supply terminals adapted for connection across a source of operating potential;
a second current source connected between the first junction and the first voltage supply terminal;
a third current source connected between the second voltage supply terminal and the collector of the third transistor;
first feedback means interconnecting the collector of the third transistor with the base of the fourth transistor;
second feedback circuit means interconnecting the bases of the third and fourth transistors, the collector of the fourth transistor providing an output from said trigger circuit.

8. The combination according to claim 7 wherein the means for connecting the emitters of the first and second transistors with the source of operating current includes first and second emitter resistors connected together at a second junction in series between the emitters of the first and second transistors, with the first current source being connected between the second junction and the second voltage supply terminal.

9. The combination according to claim 8 wherein the second feedback means includes first and second resistances connected together at a third junction in series between the collectors of the first and second transistors, and further includes means coupled between the third junction and the first voltage supply terminal for establishing a predetermined potential at the third junction.

10. The combination according to claim 8 wherein the trigger circuit is an integrated circuit and the first, second, and third current sources are constant current sources, with the first and second current sources providing a higher current than the third current source and wherein the first and second differential switch means include transistors of opposite conductivity types, respectively.

11. The combination according to claim 10 wherein the first and second transistors are lateral PNP-transistors and the third and fourth transistors are NPN-transistors.

12. The combination according to claim 11 wherein the means for connecting the base of the third transistor with the collector of the first transistor includes a fifth NPN-transistor having a collector, base, and emitter, with the emitter of the fifth transistor being connected to the base of the third transistor, the base of the third transistor being connected to the collector of the first transistor, and the collector of the fifth transistor is connected with the second voltage supply terminal, and further wherein the means for connecting the base of the fourth transistor with the collector of the second transistor includes a sixth NPN-transistor having a collector, base, and emitter with the emitter of the sixth transistor being connected to the base of the fourth transistor, the base of the sixth transistor being connected to the collector of the second transistor, and the collector of the sixth transistor being connected with the second voltage supply terminal.

13. The combination according to claim 10 wherein the means for establishing a predetermined potential at the junction at the first and second resistance means includes a plurality of diode junctions connected between the third junction and the first voltage supply terminal and further wherein the first and second current sources supply equal currents of opposite polarity and the third current source supplies current of the same polarity as the first current source and of substantially one-half the magnitude of the currents supplied by the first and second current sources.

* * * * *